United States Patent [19]

Hirayama

[11] Patent Number: 5,015,873

[45] Date of Patent: May 14, 1991

[54] SEMICONDUCTOR DRIVER FOR PRODUCING SWITCHING AND OFFSET SIGNALS

[75] Inventor: Hiromitsu Hirayama, Tokyo, Japan

[73] Assignee: NEC Corporation, Tokyo, Japan

[21] Appl. No.: 324,219

[22] Filed: Mar. 15, 1989

[30] Foreign Application Priority Data

Mar. 18, 1988 [JP] Japan ................................ 63-65347

[51] Int. Cl.$^5$ .......................... H03K 3/01; H03K 3/42
[52] U.S. Cl. .................................... 307/270; 307/443;
   307/448; 307/311; 307/362; 307/559; 307/561
[58] Field of Search .................. 372/38; 307/443, 448,
           307/311, 362, 561, 550, 270, 549, 551, 559

[56] References Cited

U.S. PATENT DOCUMENTS

| | | | |
|---|---|---|---|
| 4,622,477 | 11/1986 | Uda | 307/270 |
| 4,634,893 | 1/1987 | Craycraft et al. | 307/270 |
| 4,661,725 | 4/1987 | Chantepie | 307/443 |
| 4,792,706 | 12/1988 | Ovens et al. | 307/270 |
| 4,807,239 | 2/1989 | Tankano et al. | 372/38 |

Primary Examiner—Stanley D. Miller
Assistant Examiner—Margaret R. Wambach
Attorney, Agent, or Firm—Heilfgott & Karas

[57] ABSTRACT

A semiconductor integrated device for applying a switching signal and an offset signal in superposed relation to each other to an external load connectable between an output terminal and a power supply terminal, comprises an offset signal supplying circuit for supplying an offset signal to the output terminal and including a first field effect transistor having a drain electrode connected to the output terminal, and a second field effect transistor having substantially the same characteristics as the first field effect transistor. The second field effect transistor has a drain electrode connected to a source electrode of the first field effect transistor, a gate electrode connected to a control terminal receptive of a control signal effective to control the offset signal, and a source electrode connected to a negative power supply terminal. A constant-voltage generating circuit is provided in the circuit device for generating and applying a constant voltage to a gate electrode of the first field effect transistor. The constant-voltage generating circuit includes a resistor connected between a positive power supply terminal and the gate electrode of the first field effect transistor, and a plurality of series-connected diodes having the substantially same characteristics. A voltage between the series connected diodes is set to half of a power supply voltage applied between the positive and negative power supply terminals. Each of the diodes has an internal resistance smaller than a specific resistance of the resistor.

7 Claims, 3 Drawing Sheets

SEMICONDUCTOR DRIVER FOR PRODUCING SWITCHING AND OFFSET SIGNALS

BACKGROUND OF THE INVENTION

The present invention relates to a semiconductor integrated circuit device for driving an external load such as laser diode, and more specifically relates to a semiconductor integrated circuit device of the GaAs digital IC type having a GaAs substrate formed thereon with a plurality of Schottky junction type field effect transistors.

With the development of high speed digital signal processing technology including optical communication technology, the GaAs digital IC becomes more important for use as a semiconductor laser driver (hereinafter, referred to as "laser driver") for driving directly a semiconductor laser at an ultra high speed (c.f. Japanese Electrocommunication Society, technology research report SSD-85-140).

Hereinafter, the conventional laser driver will be explained in conjunction with the attached drawings. FIG. 1 shows a driver described in the above-mentioned document, constructed of field effect transistors (FETs) and diodes which are composed of Schottky junction type field effect transistors and diodes. These FETs and diodes are formed on a GaAs substrate together with other components.

Referring to FIG. 1, the laser driver is provided with an earth terminal 31 and a power supply terminal 32. Normally, a power supply voltage of −5.2V is applied to the power supply terminal 32 with respect to the earth terminal 31. An input signal is inputted from an input terminal 33 through a level shifting circuit comprised of FET $Q_{41}$, level shifting diode $D_{41}$ and current supplying FET $Q_{43}$ into a gate electrode of FET $Q_{46}$ which constitutes a part of output differentially operating circuit. Further, the laser driver is provided with a reference terminal 34 receptive of a reference signal such as an opposite phase signal or a reference voltage of −1.3V. The reference signal received at the reference terminal 34 is inputted through another level shifting circuit composed of FET $Q_{42}$, level shifting diode $D_{42}$ and current supplying FET $Q_{44}$ into a gate electrode of FET $Q_{45}$ which is contained in the output differentially operating circuit.

The output differentially operating circuit is comprised of the FET $Q_{45}$, a FET $Q_{46}$ and a current supplying FET $Q_{47}$, and carries out switching of an output current at ultra high speed. The gate electrode of FET $Q_{47}$ is connected to a switching current control terminal 35, and the drain terminal of FET $Q_{46}$ is connected to an output terminal 37. Further, an FET $Q_{48}$ has a function of supplying an offset current, and the gate electrode thereof is connected to an offset current control terminal 36 and the drain terminal thereof is connected to the output terminal 37.

In the prior art laser driver having the above-described structure, the drain current flowing through the FET $Q_{48}$ is applied to a load in the form of a laser diode 38 as an offset current $I_o$, and the drain current flowing through the FET $Q_{47}$ included in the output differentially operating circuit is also applied to the load as a switching current $I_s$. The offset current $I_o$ can be controlled by applying externally a control voltage to the offset current control terminal 36, and the switching current $I_s$ can be controlled by applying externally another control voltage to the switching current control terminal 35.

In general, a needed maximum value of the switching current $I_s$ is about 50 mA, and a needed variable range of the offset current $I_o$ is from 0 mA to 100 mA. The set value of offset current $I_o$ is determined according to a threshold current of the laser diode 38.

FIG. 2 shows the relation between the above-described offset current $I_o$ and switching current $I_s$. In FIG. 2, a waveform $\overline{a}$ represents a time-responsive waveform of the output current where the magnitude of offset current $I_o$ is indicated by $\overline{b}$, and the amplitude of switching current $I_s$ is indicated by $\overline{c}$.

However, the above-described prior art laser driver has the following drawbacks. As apparent from FIG. 2, when the set value of offset current $I_o$ (indicated by $\overline{b}$) is zero, the minimum magnitude of the output current becomes zero. In such a case, as apparent from FIG. 1, a voltage $V_{DS}$ between the drain and source electrodes of FET $Q_{48}$ which has the function of supplying the offset current is held about 5.2V. Further, in a similar manner, when the offset current $I_o$ is set to a zero value, a voltage $V_{GS}$ between the gate and source electrodes of FET $Q_{48}$ must satisfy the following relation (1) such that the value of $V_{GS}$ exceeds the threshold value $V_{th}$ of the FET $Q_{48}$.

$$V_{GS} < V_{th} \tag{1}$$

Normally, the threshold value $V_{th}$ is set within the range from about −1.0V to about 0.5V for the high speed operation. On the other hand, a high performance FET is utilized as FET $Q_{48}$ in the laser driver so as to obtain the high speed operation characteristic. Such a high performance FET has a reverse withstanding voltage of about −6V to −5V between the gate and drain electrodes.

In this connection, the voltage $V_{GD}$ applied between the gate and drain electrodes of FET $Q_{48}$ used in the prior art shown in FIG. 3 is represented according to the following relation (2) by using the relation (1).

$$V_{GD} = V_{GS} - V_{DS} < V_{th} - V_{DS} \tag{2}$$

As described above, since the value of $V_{th}$ is set to −1.0V to −0.5V and the maximum value of $V_{DS}$ is 5.2V, the value of $V_{GD}$ is represented by:

$$V_{GD} < -6.7V \text{ to } -5.7V$$

Consequently, the maximum value of $V_{GD}$ can be very close to −6.7V through −5.7V and therefore is comparable to the reverse withstanding voltage of −6V through −5V in the offset current supplying FET $Q_{48}$ used in the prior art laser driver of FIG. 1. For this reason, when carrying out the high speed operation, the FET $Q_{48}$ is actually operated under the state close to the limit capacity, thereby causing reliability problems such as deterioration of FET $Q_{48}$.

In order to eliminate the drawbacks of the first prior art laser driver, the inventor devised a laser driver such as shown in FIG. 3. In the figure, the same components are designated by the same reference numerals as in FIG. 1, and therefore the detailed description thereof is omitted.

Referring to FIG. 3, an offset current supplying FET $Q_{49}$ and voltage dividing FET $Q_{50}$ are connected between the power supply terminal 32 and output terminal 37. Namely, the source electrode of FET $Q_{49}$ is connected to the power supply terminal 32, the drain electrode of FET $Q_{49}$ is connected to the source terminal of FET $Q_{50}$, and the drain electrode of FET $Q_{50}$ is connected to the output terminal 37. Further, the gate electrode of FET $Q_{49}$ is connected to the offset current control terminal 36.

A pair of voltage dividing resistors $R_{41}$ and $R_{42}$ are series-connected between the earth terminal 31 and power supply terminal 32, and the junction point therebetween is connected to the gate electrode of FET $Q_{50}$.

In this devised structure, the FETs $Q_{49}$ and $Q_{50}$ are formed to have the same structure and parameters such as pattern dimensions of parts and threshold voltage. Further, the voltage dividing resistors $R_{41}$ and $R_{42}$ are formed to have the same parameters such as resistance. For this reason, a potential at the gate electrode of FET $Q_{50}$ is set to $-2.6V$ which is a half of the power supply voltage $-5.2V$ applied between the earth terminal 31 and power supply terminal 32. In addition, the resistance of the resistors $R_{41}$ and $R_{42}$ is set to about $1k\Omega$, respectively, so as to avoid the increase in current consumption. In this case, the total power consumption of about 13.5 mW is consumed by the resistors $R_{41}$ and $R_{42}$, and such a value can be negligible in actual use.

As described above, in FIG. 3, the FETs $Q_{49}$ and $Q_{50}$ have the identical structure and the gate potential of FET $Q_{50}$ is fixed to $-2.6V$. For this reason, when both of the offset current $I_o$ and switching current $I_s$ become zero, a voltage $V_{DS}$ between the drain and source electrodes of FET $Q_{49}$ is held $2.6V + V_{th}$, and another voltage $V_{DS}$ between the drain and source electrodes of FET $Q_{50}$ is held $2.6V - V_{th}$ where $V_{th}(V)$ is a threshold voltage of FET $Q_{49}$. Further, a voltage $V_{GD}$ between the gate and drain electrodes of FET $Q_{50}$ is held $-2.6V$ and another $V_{GD}$ between the gate and drain electrodes of FET $Q_{49}$ is held about $2V_{th}-2.6V$. In this case, the value of $V_{GD}$ of FET $Q_{49}$ is held in the range from $-4.6V$ to $-3.5V$ when the value of $V_{th}$ is set to the range between $-1V$ and $-0.5V$. Accordingly, in FIG. 3, since a load voltage exceeding the reverse withstanding voltage from $-6V$ to $-5V$ between the gate and drain electrodes cannot be applied to the respective FETs $Q_{49}$ and $Q_{50}$, a laser driver having high reliability can be obtained.

However, in the laser driver of FIG. 3, the additional function to vary the offset current $I_o$ within the range from 0 mA to 100 mA is needed in accordance with the threshold current value of laser diode 38 to be driven as described above. On the other hand, with the need for higher speed processing in a general digital IC including GaAs digital IC, a new problem relating to the interface emerges, and therefore the additional function is needed to vary the offset voltage of output signal.

In this regard, when providing the function to change the offset current (or offset voltage) over a wide range in the circuit shown in FIG. 3, there is caused a problem that a waveform of high frequency modulation is deteriorated.

Hereinafter, this problem will be explained. As described already, the variable range from about 0V to 100 mA is needed for the offset current $I_o$ in the laser driver. In this case, the respective gate electrode of FETs $Q_{49}$ and $Q_{50}$ must have the gate width of about 400 μm through 600 μm in order to flow a relatively large current through the FETs $Q_{49}$ and $Q_{50}$. In addition, when controlling the offset current $I_o$ by applying an external control voltage to the offset current control terminal 36, the respective voltage $V_{GS}$ between the gate and source electrodes of FETs $Q_{49}$ and $Q_{50}$ is set to 0.4V through 0.5V.

In this case, a parasitic capacitor $C_{gd}$ between the gate and drain electrodes of FET $Q_{50}$ has a capacitance more or less exceeding 0.3 pF through 0.5 pF due to the great width of the gate electrode and the forward biasing of 0.4V through 0.5V between the gate and source electrodes. Further, by the combination of capacitance of capacitor $C_{gd}$ of FET $Q_{50}$ and resistances of voltage dividing resistors $R_{41}$ and $R_{42}$, the transition characteristic of output current outputted from the output terminal should have long time-dependent component.

Since the resistors $R_{41}$ and $R_{42}$ have the resistance of $1k\Omega$, respectively, and the capacitor $C_{gd}$ has the capacitance of 0.3 pF through 0.5 pF, a time constant defined as the product of the parallel composite resistance of resistors $R_{41}$ and $R_{42}$ and the capacitance of capacitor $C_{gd}$ is calculated to 150 psec through 250 psec. Such order of time constant cannot be neglected in ultra high speed modulation characteristic on the order of Gb/sec. Such a situation will be explained with reference to FIG. 4.

Referring to FIG. 4, the level of offset current $I_o$ is indicated by $\bar{d}$ when $I_o=0$, the amplitude of switching current $I_s$ is indicated by $\bar{e}$ when $I_o=0$, and the waveform of switching current $I_s$ is indicated by $\bar{f}$ when $I_o=0$. In case of $I_o=0$, the respective voltage $V_{GS}$ of FETs $Q_{49}$ and $Q_{50}$ is reverse biased as $V_{GS}<V_{th}$ so that the above described deterioration of high frequency modulating signal waveform due to the capacitor $C_{gd}$ is not remarkable.

On the other hand, the DC level of offset current $I_o$ is indicated by $\bar{g}$ when the respective FETs $Q_{49}$ and $Q_{50}$ are forward biased at 0.4V through 0.5V between the gate and source electrodes thereof. The level of offset current $I_o$ is set to a great value of 80 mA through 100 mA, and the amplitude of switching current $I_s$ is indicated by $\bar{h}$ and the output waveform of switching current $I_s$ is indicated by $\bar{i}$. In this case, due to the affect of time constant defined by the product of the parallel composite resistance of resistors $R_{41}$ and $R_{42}$ and the capacitance of capacitor $C_{gd}$, the peak level of output current waveform $\bar{i}$ cannot reach the level of offset current $I_o$ indicated by $\bar{g}$. Accordingly, the high level of envelope of output current waveform is different from the DC level of offset current $I_o$.

Such deterioration of high frequency modulating signal waveform becomes remarkable when the modulating or switching speed exceeds about 1 Gb/sec, thereby causing practically difficult problem. In this case, it is apparent that the maximum operating speed is affected.

By reducing the resistances of voltage dividing resistors $R_{41}$ and $R_{42}$, the above-mentioned time constant could be reduced as desired. For example, if the resistances of resistors $R_{41}$ and $R_{42}$ were set to $100\ \Omega$, respectively, the above-mentioned time constant could be 15 psec through 25 psec and the problem of waveform deterioration could be avoided. However, in such a case, the total electric power consumed in the resistors $R_{41}$ and $R_{42}$ could reach 140 mW through 150 mW to cause practical problem.

SUMMARY OF THE INVENTION

In order to solve the above-described problems of the prior art structure and the inventor's devised structure, an object of the present invention is to provide a semiconductor integrated circuit device in which wasted power is not consumed, and the deterioration of FETs due to the application of voltage close to the reverse withstanding voltage thereof between the gate and drain electrodes thereof and deterioration of high frequency modulating signal waveform can be eliminated.

According to the present invention, the semiconductor integrated circuit device includes an offset current or offset voltage regulating circuit comprised of a first field effect transistor having a drain electrode connected to an output terminal, a second field effect transistor having substantially the same characteristics as the first field effect transistor, the second field effect transistor having a drain electrode connected to a source electrode of the first field effect transistor, a gate electrode connected to a control terminal receptive of a control current effective to control an offset signal supplied by the second field effect transistor and a source electrode connected to a negative power supply terminal, a resistor connected between a positive power supply terminal and the gate electrode of the first field effect transistor, and a plurality of diodes having the substantially the same characteristics and being forwardly series-connected to each other such that an anode of the first stage diode is connected to the gate electrode of the first field effect transistor and a cathode of the last stage diode is connected to the negative power supply terminal. The device is characterized in that a voltage between the series-connected diodes is set to half of a power supply voltage applied between the positive and negative power supply terminals and that each of the diodes has an internal resistance smaller than a specific resistance of the resistor.

According to the present invention the resistors and a plurality of diodes connected in series actually function as a constant voltage generating circuit. Namely, since the anode of the first stage diode in the plural diodes is held at the potential which is half of the voltage applied between the power supply terminals, the gate electrode of the first FET is always held at half of the power supply voltage. For this reason, when the power supply voltage is set to, for example, −5.2V, and the threshold voltage of the first FET (or second FET) is set to $V_{th}$, the voltages $V_{DS}$ between the drain and source electrodes of the first and second FETs are held at $2.6V + V_{th}$ and $2.6V − V_{th}$, respectively.

Further, the voltages $V_{GS}$ between the gate and drain electrodes of the first and second FETs are held at about −2.6V and $2V_{th} − 2.6V$, respectively. Normally, since the value of $V_{th}$ is selected between about −1V and −0.5V, the voltage $V_{GD}$ of the second FET is held at about −4.6V through −3.5V.

Accordingly, in view of the fact that the reverse withstanding voltages between the gate and drain electrodes of the first and second FETs have a value of about −6V through −5V, an excessive voltage close to the reverse withstanding voltage is not applied between the gate and drain electrodes of the first or the second FET, thereby preventing the deterioration of the FETs.

Moreover, since each of the plural diodes has an internal resistance much smaller than that of the resistor in the above-described constant voltage generating circuit, the value of current flowing through this circuit is suppressed to a small amount substantially according to the resistance of the resistor, and therefore the power consumption is sufficiently reduced in the constant voltage generating circuit.

Further, since the parallel composite resistance of the resistor and the plural diodes is substantially equal to a combined internal resistance of the plurality of series-connected diodes, the time constant defined by the product of parasitic capacity between the gate and drain region of first FET and the parallel composite resistance is sufficiently reduced. For this reason, the deterioration of high frequency modulating signal waveform can be sufficiently suppressed.

DESCRIPTION OF THE PREFERRED EMBODIMENTS

Hereinafter, embodiments of semiconductor laser driver according to the present invention will be explained in conjunction with the attached drawings.

Figure 5:
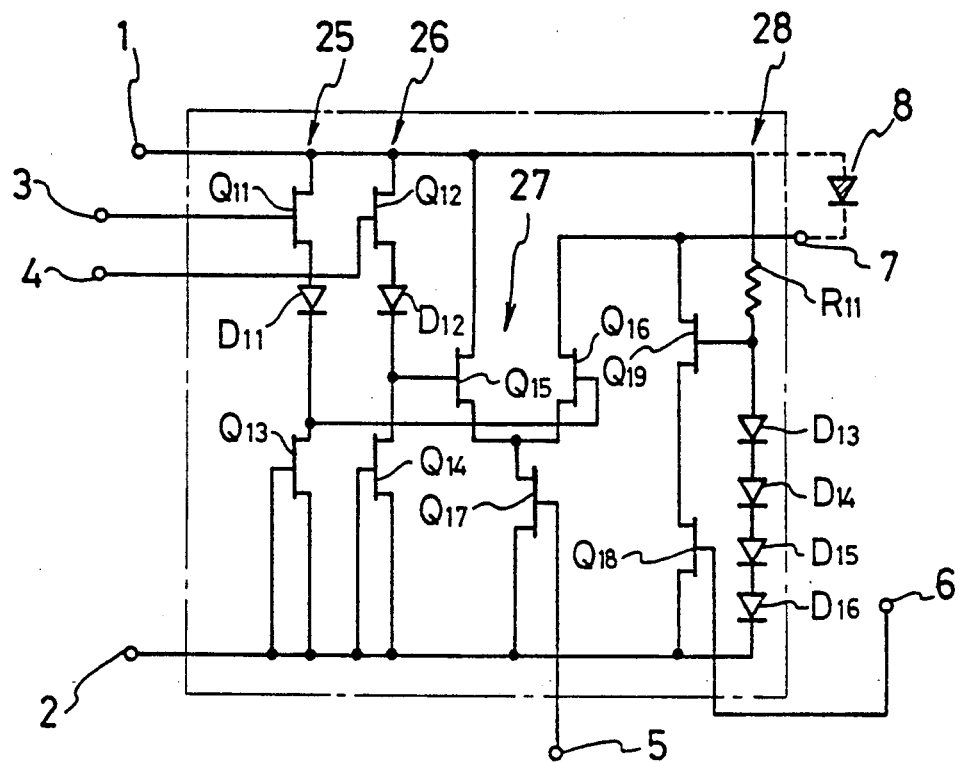
FIG. 5 is an equivalent circuit diagram of a first embodiment of the laser driver according to the present invention.

First, referring to FIG. 5, the first embodiment is explained. Various types of field effect transistors used in the embodiment are each composed of a Schottky junction type field effect transistor and various types of diodes used in the embodiment are composed of Schottky junction type diodes. Further, these field effect transistors and diodes are formed on a semiconductor substrate composed of GaAs together with other components.

As shown in FIG. 5, the semiconductor laser driver is provided with an earth or positive power terminal 1 and a negative power supply terminal 2. Normally, a voltage of −5.2V is applied between the earth terminal 1 and power supply terminal 2 to power the semiconductor laser driver. Further, a pair of first and second level-shifting circuits 25 and 26 are connected in parallel to each other between the earth terminal 1 and power supply terminal 2. The first level-shifting circuit 25 is comprised of a field effect transistor (hereinafter, referred to as "FET") $Q_{11}$, a level-shifting diode $D_{11}$ and a current-supplying FET $Q_{13}$ connected in series to each other. A gate electrode of the FET $Q_{11}$ is connected to an input terminal 3 and receives an input signal such that the first level-shifting circuit 25 shifts or regulates the voltage level of input signal according to a given standard. The second level-shifting circuit 26 is comprised of a FET $Q_{12}$, level-shifting diode $D_{12}$ and a current-supplying FET $Q_{14}$ connected in series to each other. A gate electrode of the FET $Q_{12}$ is connected to a reference terminal 4 and receives a reference signal such as, for example, a signal having a phase opposite to that of the input signal so that the second level-shifting circuit 26 shifts or regulates the voltage level of reference signal according to a given standard.

An output differentially-operating circuit 27 is connected subsequently to the first and second level-shifting circuits 25 and 26 to differentially operate or process the level-shifted input and reference signals with each other to thereby produce an output signal in the form of a switching current $I_s$ effective to drive an external laser diode 8. Namely, the differentially-operating circuit 27 is comprised of a pair of FETs $Q_{15}$ and $Q_{16}$ connected in parallel to each other and a current supplying FET $Q_{17}$ connected in series to the pair of FETs $Q_{15}$ and $Q_{16}$. More specifically, a gate electrode of the FET $Q_{15}$ is branch-connected to a cathode of the level-shifting diode $D_{12}$ and a drain electrode of the FET $Q_{15}$ is connected to the earth terminal 1. Further, a gate electrode of the FET $Q_{16}$ is branch-connected to a cathode of the level-shifting diode $D_{11}$ and a drain electrode of the FET $Q_{16}$ is connected to an output terminal 7 which is connectable to the external laser diode 8. The current supplying FET $Q_{17}$ has a source electrode connected to the power supply terminal 2, a drain electrode connected to the source electrodes of FETs $Q_{15}$ and $Q_{16}$, and a gate electrode connected to a switching current control terminal 5 receptive of a first control signal effective to control or regulate the switching current $I_s$.

An offset current supplying circuit is connected subsequently to the differentially-operating circuit 27 to supply an offset or bias current $I_o$ to the external laser diode 8 in superposed relation to the switching current $I_s$. The offset current supplying circuit is comprised of an offset current supplying FET $Q_{18}$ for supplying the offset current $I_o$ and a voltage-dividing FET $Q_{19}$ connected in series to the FET $Q_{18}$ for dividing a voltage between the power supply terminal 2 and the output terminal 7. Namely, the offset current supplying FET $Q_{18}$ has a source electrode connected to the power supply terminal 2, a drain electrode connected to a source electrode of the FET $Q_{19}$ and a gate electrode connected to an offset current control terminal 6 receptive of a second control signal effective to control or regulate the offset current $I_o$. The voltage-dividing FET $Q_{19}$ has a drain electrode connected to the output terminal 7.

The FETs $Q_{18}$ and $Q_{19}$ have electrically and thermally identical characteristics. Stated otherwise, the FETs $Q_{18}$ and $Q_{19}$ have substantially the same structure and parameters with respect to, for example, the pattern dimension of portions thereof and threshold voltage.

Further, a constant voltage generating circuit 28 is connected subsequently to the series-connected FETs $Q_{18}$ and $Q_{19}$. The constant voltage generating circuit 28 is comprised of a resistor $R_{11}$ and group of diodes $D_{13}$–$D_{16}$ series-connected to each other between the earth terminal 1 and power supply terminal 2. The constant voltage generating circuit 28 is connected at its junction between the resistor $R_{11}$ and the anode of the diode $D_{13}$ to a gate electrode of the FET $Q_{19}$ to apply thereto a constant voltage so as to control the voltage-dividing FET $Q_{19}$. In this case, the resistor $R_{11}$ has a resistance of 1kΩ, and each of the diodes $D_{13}$–$D_{16}$ has an internal resistance $r_i$ of less than 10 Ω and a forward drop voltage $V_f$ of 0.65V between the cathode and anode thereof.

Lastly, as mentioned above, the external laser diode 8 is connected between the earth terminal and the output terminal 7 as a load.

Next, the operation of the embodiment of the semiconductor laser driver as described above will be explained hereinbelow.

An input signal is inputted from the input terminal 3 into the gate electrode of FET $Q_{16}$ included in the differentially-operating circuit 27 through the first level-shifting circuit 25. Also, a reference signal in the form of a reference voltage of $-1.3V$ or a signal having a phase opposite to that of the input signal is inputted from the reference terminal 4 into the gate electrode of FET $Q_{15}$ included in the differentially-operating circuit 27 through the second level-shifting circuit 26.

The output differentially-operating circuit 27 operates when receiving the input and reference signals to effect intermittent switching or modulation of a drain current flowing through the current supplying FET $Q_{17}$ at ultra high speed in response to the voltage difference between the input and reference signals to thereby produce a switching current $I_s$. The switching current $I_s$ can be controlled or regulated according to the application of a first external control voltage to the switching current control terminal 5.

Another drain current flowing through the FET $Q_{19}$ and supplied from the FET $Q_{18}$ is applied as an offset or bias current $I_o$ to the laser diode 8 in superposed relation to the switching current $I_s$ to thereby intermittently drive the laser diode 8. The offset current $I_o$ can be controlled or regulated according to the application of a second external control voltage to the offset current control terminal 6.

With regard to the constant voltage generating circuit 28, as described above, each of the series-connected diodes $D_{13}$–$D_{16}$ has a forward drop voltage $V_f=0.65V$ between the anode and cathode thereof. Accordingly, the anode voltage at the anode of diode $D_{13}$ is fixed to a constant value of $-5.2V+4\times0.65V=-2.6V$ where the voltage value of $-5.2V$ represents the power supply voltage at the power supply terminal 2 with respect to the earth terminal 1. A voltage of $-2.6V$ is applied across the resistor $R_{11}$ which has a resistance of 1kΩ so that the current of $2.6V/1k\Omega=2.6$ mA flows through the resistor $R_{11}$. Consequently, the total power consumption of $2.6$ mA$\times1-5.21V=$about 13 mW is consumed in the resistor $R_{11}$ and the group of diodes $D_{13}$–$D_{16}$, and such value is practically negligible.

Figure 4:
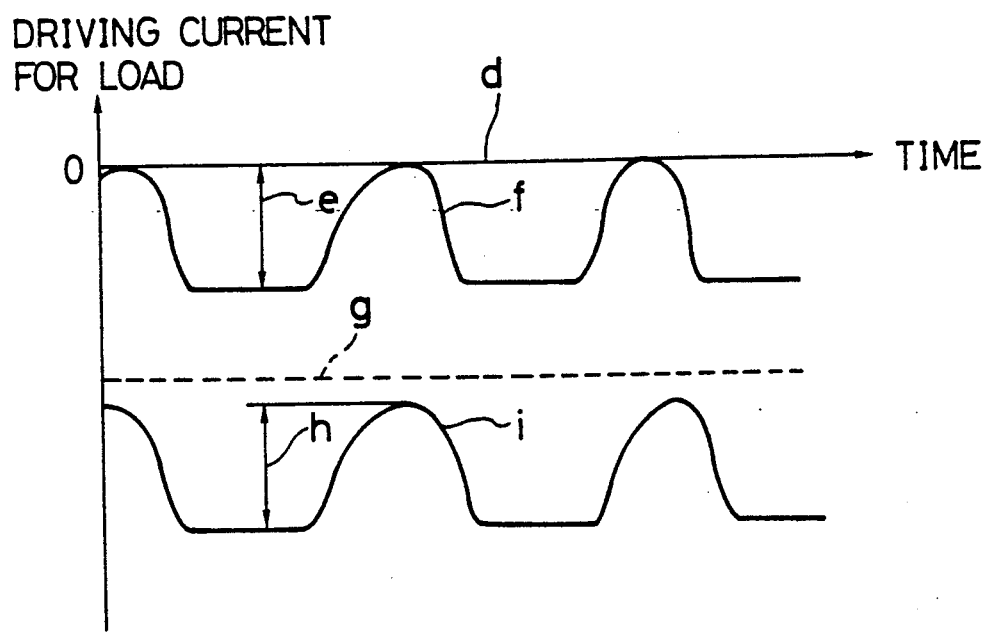
FIG. 4 is a waveform diagram showing the relation among the offset current, the amplitude of switching current and the waveform of output current in the prior-devised structure shown in FIG. 3.

Further, since the anode potential of diode $D_{13}$ is fixed to $-2.6V$, the gate potential at the gate electrode of FET $Q_{19}$ is always set to the value of $-2.6V$. Accordingly, the operation of FETs $Q_{18}$ and $Q_{19}$ is substantially identical to that used in the second prior embodiment (art) shown in FIG. 4. Namely, when both of the offset current $I_o$ and output switching current $I_s$ are zero, a drain-source voltage $V_{DS}$ between the drain and source electrodes of FET $Q_{19}$ equals to $2.6+V_{th}(V)$, and another drain-source voltage $V_{DS}$ between the drain and source electrodes of FET $Q_{18}$ equals to $2.6-V_{th}(V)$ where $V_{th}$ is the threshold voltage of FET $Q_{19}$. A gate-drain voltage $V_{GD}$ between the gate and drain electrodes of FET $Q_{19}$ equals to $-2.6V$, and another gate-drain voltage $V_{GD}$ between the gate and drain electrodes of FET $Q_{18}$ equals to $2V_{th}-2.6V$. In this case, when the value of $V_{th}$, ranges from $-1V$ to $-0.5V$, the value of $V_{GD}$ of FET $Q_{18}$ is set to range from $-4.6V$ to $-3.5V$. Consequently, in this embodiment, no excessive load voltage is applied between the gate and drain electrodes of FETs $Q_{18}$ and $Q_{19}$, respectively, not exceeding reverse-withstanding voltage of $-6V$ to $-5V$ thereof, thereby avoiding the deterioration thereof due to application of excessive load voltage thereto.

Moreover, since each of the diodes $D_{13}$–$D_{16}$ has an internal resistance $r_i$ of less than 10 Ω, the time constant defined by the product of the parallel composite resistance of resistor $R_{11}$ and group of diodes $D_{13}$–$D_{16}$, and the parasitic capacity $C_{gd}$ (0.3 pF to 0.5 pF) formed between the gate and drain electrodes of FET $Q_{19}$ equals to the order of $C_{gd} \times 40$ Ω i.e., 12 psec to 15 psec which is smaller by one order than that in the second prior embodiment (art) structure. If the time constant has such value, the wave form of high frequency switching or modulated signal cannot be deteriorated even if the switching or modulation speed exceeds 1 Gb/sec, thereby achieving an excellent ultra high frequency modulation characteristic.

Figure 1:
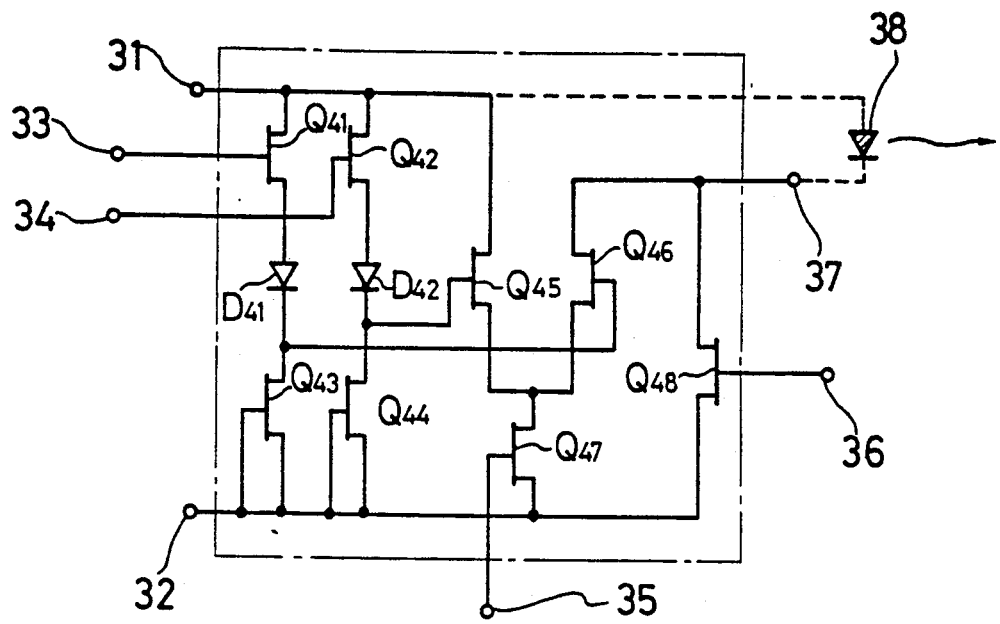
FIG. 1 is an equivalent circuit diagram of the prior art laser driver.
Figure 2:
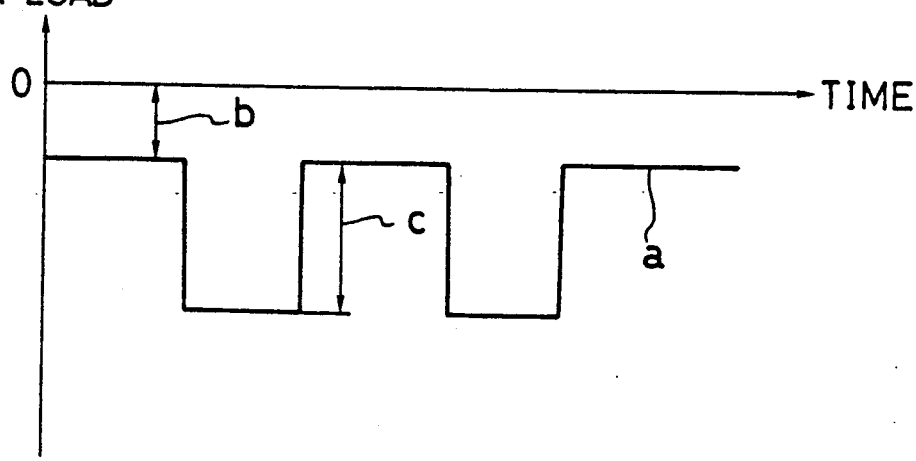
FIG. 2 is a waveform diagram showing the output current waveform of the prior art laser driver shown in FIG. 1 and the relation between offset and switching currents.
Figure 3:
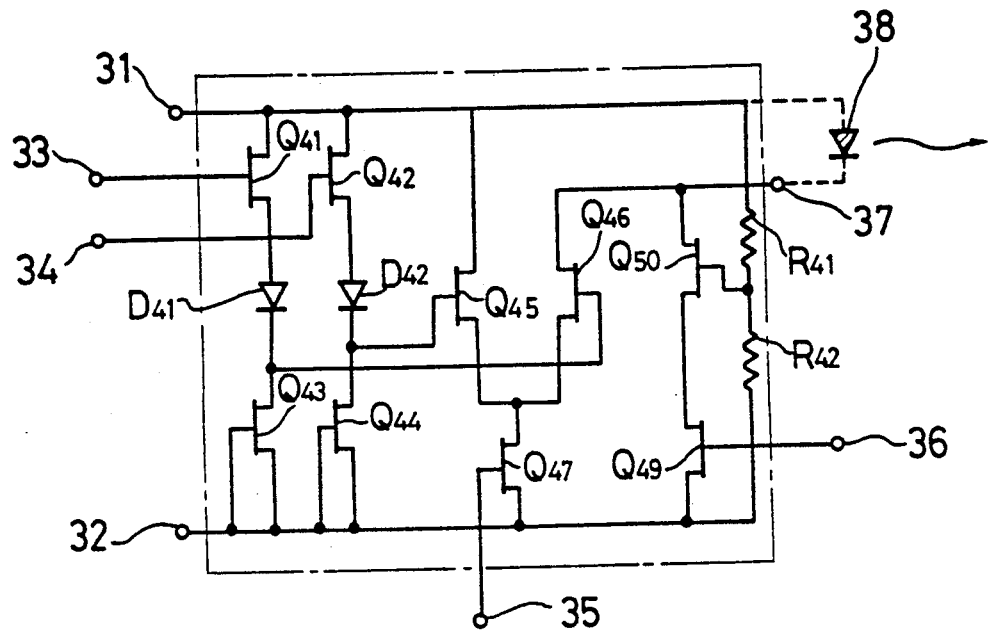
FIG. 3 is an equivalent circuit diagram of the laser driver prior-devised by the inventor.
Figure 6:
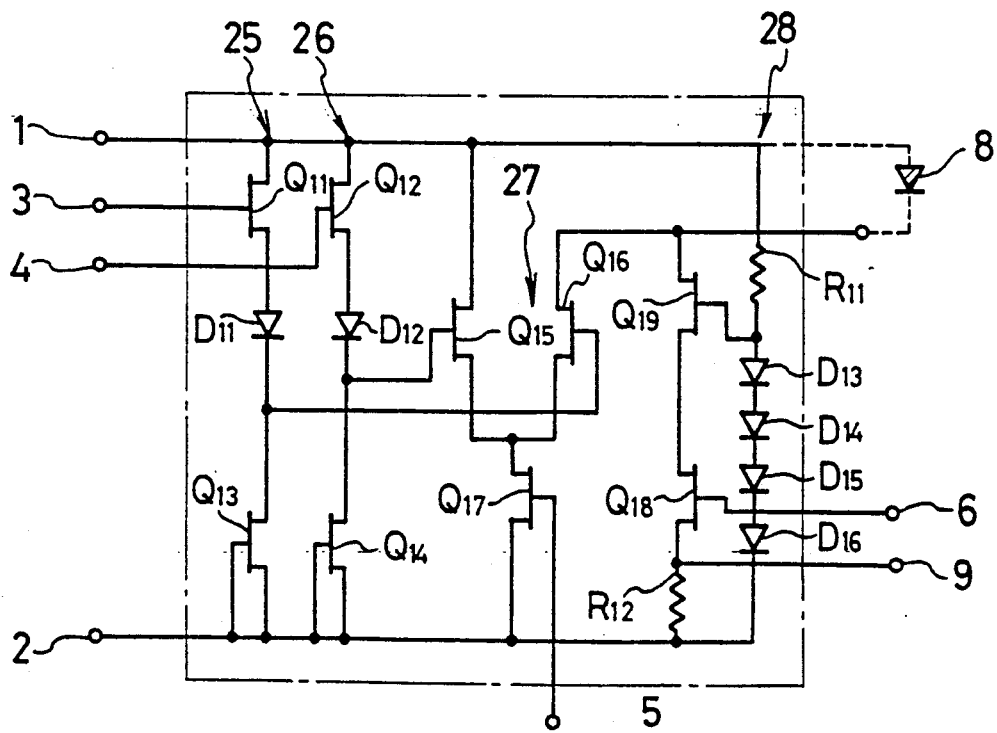
FIG. 6 is an equivalent circuit diagram of a second embodiment of the laser driver according to the present invention.

Referring to FIG. 6, a second embodiment according to the present invention is explained hereinbelow. The same elements are designated by the same reference numerals as in FIG. 1 and therefore the detailed description thereof is omitted. As shown in FIG. 6, an additional resistor $R_{12}$ is connected between the source electrode of the offset current supplying FET $Q_{18}$ and the power supply terminal 2 for monitoring the offset current $I_o$. The resistance of resistor $R_{12}$ is set to about 10 Ω. An offset current monitoring terminal 9 is branch-connected to the source electrode of FET $Q_{18}$. As apparent from the circuit construction shown in FIG. 6, the additional resistor $R_{12}$ does not deteriorate the waveform of switching or high-frequency-modulating signal effective to intermittently switching the laser diode.

According to this embodiment as described above, the potential difference between the monitoring terminal 9 and the power supply terminal 2 is measured so as to easily monitor the offset current $I_o$. Such monitoring is considerably effective for automatic stabilization of the output of the laser diode 8 and prevention of the laser diode destruction.

As explained above, the first and second embodiments are used as a current modulating element for driving the laser diode; however, the present invention is not limited to such application. Namely, the present invention can be widely applied to a general semiconductor integrated circuit device having controlling function for offset current or voltage.

As described above, the present invention has following advantages:

1. The electric power consumption is sufficiently reduced in the constant voltage generating circuit which applies a constant voltage to the gate electrode of the voltage-dividing FET.

2. The FETs can be driven with a voltage sufficiently smaller than the reverse withstanding voltage between the gate and drain electrodes of the FETs so that the deterioration of the FETs can be easily prevented.

3. In case that the offset current is set to a relatively great amount of 30mA to 100mA or the offset voltage is set to a relatively great amount in a similar manner, the deterioration of high frequency output switching signal which is caused by the time constant defined by the product of parasitic capacity between the gate and drain electrodes of the voltage-dividing FET and the parallel composite resistance of the constant voltage generating circuit, and which would cause drawbacks in the conventional structure can be easily prevented.

4. Means for monitoring the offset current (or offset voltage) can be added so as to effectively carry out the automatic stabilization of output in the load such as laser diode and the prevention of destruction of the load.

What is claimed is:

1. A semiconductor integrated circuit device for applying a switching current and an offset current in superposed relation to each other to an external load connectable between an output terminal and a first power supply terminal, the device comprising:

switching current supplying circuit means for supplying a switching current to said output terminal;

offset current supplying circuit means for supplying an offset current to said output terminal, said offset current supplying circuit means including a first field effect transistor having a drain electrode connected to said output terminal, and a second field effect transistor having substantially the same characteristics as said first field effect transistor and having a drain electrode connected to a source electrode of said first field effect transistor, a gate electrode connected to an offset current control terminal receptive of a control voltage effective to control the offset current, and a source electrode connected to a second power supply terminal; and constant voltage generating circuit means for generating and applying a constant voltage to a gate electrode of the first field effect transistor, said constant voltage generating circuit means including a resistor connected between said first power supply terminal and the gate electrode of the first field effect transistor, and a plurality of diodes having substantially the same characteristics and being forwardly series-connected to each other such that an anode of a first stage diode in said plurality of the forwardly series-connected diodes is connected to the gate electrode of the first field effect transistor and a cathode of a last stage diode in said plurality of the forwardly series-connected diodes is connected to said second power supply terminal so that a voltage between said plurality of the series-connected diodes is set to a half of a power supply voltage applied between said first and second power supply terminals, each of said series-connected diodes having an internal resistance smaller than a specific resistance of said resistor.

2. A semiconductor integrated circuit device as claimed in claim 1, wherein each of said forwardly series-connected diodes has a forward drop voltage between an anode and a cathode thereof equal to:

$$\frac{\text{half of the power supply voltage}}{\text{number of the diodes}}.$$

3. A semiconductor integrated circuit device as claimed in claim 1, wherein said series-connected diodes have a total internal resistance smaller than the specific resistance of said resistor.

4. A semiconductor integrated circuit device as claimed in claim 1, and further comprising an additional resistor connected between the source electrode of said second field effect transistor and said second power supply terminal for monitoring the offset current.

5. A semiconductor integrated circuit device as claimed in claim 1, and further comprising a semiconductor substrate composed of GaAs and integrating thereon said field effect transistors, said resistor and said diodes, said transistors being Schottky type field effect transistors and said diodes being Schottky type diodes.

6. A semiconductor integrated circuit device for applying to an external load connectable between an output terminal and a first power supply terminal, a switching current in response to an input frequency signal and an offset current, the device comprising:

means supplying an input frequency signal;

first current supplying means for supplying a switching current to said output terminal, said first supplying means including a first and second transistors ($Q_{15}$ and $Q_{16}$) connected in series between said output terminal and said first power supply terminal, and switchable alternately with one another in response to said input frequency signal, and a transistor ($Q_{17}$) connected between a junction point of said first and second transistors ($Q_{15}$ and $Q_{16}$) and a second power supply terminal to supply a current such that said current is modulated by the two transistors ($Q_{15}$ and $Q_{16}$) to output the switching current at said output terminal.

second current supplying means for supplying an offset current to said output terminal, said second current supplying means including a third transistor ($Q_{19}$) having a drain electrode connected to said output terminal, and fourth transistor ($Q_{18}$) having substantially the same characteristics as said third transistor ($Q_{19}$) and having a drain electrode connected to a source electrode of said third transistor ($Q_{19}$), a gate electrode connected to an offset current control terminal receptive of a control signal effective to control the offset current, and a source electrode connected to said second power supply terminal; and constant voltage generating circuit means for generating and applying a constant voltage to a gate electrode of said third transistor ($Q_{19}$), said constant voltage generating circuit means including a resistor ($R_{11}$) connected between said first power supply terminal and the gate electrode of said third transistor ($Q_{19}$), and a plurality of diodes ($D_{13}$, $D_{14}$, $D_{15}$, and $D_{16}$) having substantially the same characteristics and being forwardly series-connected to each other such that an anode of a first stage diode ($D_{13}$) of said plurality of the forwardly series-connected diodes is connected to the gate electrode of said third transistor ($Q_{19}$) and a cathode of a last stage diode ($D_{16}$) of said plurality of the forwardly series-connected diodes is connected to said second power supply terminal so that a voltage between the series-connected diodes ($D_{13}$–$D_{16}$) is set to a half of a power supply voltage applied between said first and second power supply terminals, each of the series-connected diodes ($D_{13}$–$D_{16}$) having an internal resistance smaller than a specific resistance of said resistor ($R_{11}$).

7. A semiconductor integrated circuit device as claimed in claim 6; and further comprising an additional resistor ($R_{12}$) connected between the source electrode of said fourth transistor ($Q_{18}$) and said second power supply terminal for monitoring said offset current.

* * * * *